United States Patent
Tani et al.

(10) Patent No.: US 9,552,756 B2
(45) Date of Patent: Jan. 24, 2017

(54) METHOD FOR REPAIRING ORGANIC LIGHT EMITTING DISPLAY

(71) Applicant: LG Display Co., Ltd., Seoul (KR)

(72) Inventors: Ryosuke Tani, Gyeonggi-do (KR); Joonmin Park, Gyeonggi-do (KR); Shinji Takasugi, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/460,528

(22) Filed: Aug. 15, 2014

(65) Prior Publication Data

US 2015/0187249 A1 Jul. 2, 2015

(30) Foreign Application Priority Data

Dec. 30, 2013 (KR) .................. 10-2013-0166672

(51) Int. Cl.
*G09G 3/20* (2006.01)
*G09G 3/32* (2016.01)
*G09G 3/00* (2006.01)

(52) U.S. Cl.
CPC ............ *G09G 3/2003* (2013.01); *G09G 3/006* (2013.01); *G09G 3/3208* (2013.01);
(Continued)

(58) Field of Classification Search
CPC .... G09G 3/006; G09G 3/2003; G09G 3/3208; G09G 3/3225; G09G 2320/0233; G09G 2320/0242; G09G 2320/0285; G09G 2320/029; G09G 2320/0295; G09G 2300/0426; G09G 2300/043; G09G 2300/0452; G09G 2300/08; G09G 2300/0804; G09G 2300/12; G09G 2330/10; G09G 2360/16; H01L 2251/568
(Continued)

(56) References Cited

U.S. PATENT DOCUMENTS

2007/0109327 A1* 5/2007 Cok ...................... G09G 3/2003
345/690
2007/0126460 A1* 6/2007 Chung .................. G09G 3/3648
345/98
(Continued)

FOREIGN PATENT DOCUMENTS

CN 103165077 A 6/2013
JP 2007-156407 A 6/2007
(Continued)

OTHER PUBLICATIONS

Extended Eurporean Search Report dated Aug. 14, 2014 for European patent application No. 14172967.3.
(Continued)

*Primary Examiner* — Amare Mengistu
*Assistant Examiner* — Jennifer Zubajlo
(74) *Attorney, Agent, or Firm* — Morgan, Lewis & Bockius LLP

(57) ABSTRACT

A method for repairing an organic light emitting display having a plurality of unit pixels each including a white subpixel is provided. The method includes detecting a defective white subpixel by checking circuit units of the white subpixels, connecting a circuit unit of a neighboring subpixel positioned adjacent to the defective white subpixel in the unit pixel with a light emitting unit of the defective white subpixel using a repair conductive pattern, storing a repair position to which the repair conductive pattern is connected, and compensating for digital video data that will be input to the repair position.

12 Claims, 10 Drawing Sheets

(52) U.S. Cl.
CPC ..... *G09G 3/3225* (2013.01); *G09G 2300/043* (2013.01); *G09G 2300/0426* (2013.01); *G09G 2300/0452* (2013.01); *G09G 2300/0804* (2013.01); *G09G 2320/029* (2013.01); *G09G 2320/0233* (2013.01); *G09G 2320/0242* (2013.01); *G09G 2320/0285* (2013.01); *G09G 2320/0295* (2013.01); *G09G 2330/08* (2013.01); *G09G 2330/10* (2013.01); *G09G 2330/12* (2013.01); *G09G 2360/16* (2013.01); *H01L 2251/568* (2013.01)

(58) Field of Classification Search
USPC .......................................................... 345/98
See application file for complete search history.

(56) References Cited

U.S. PATENT DOCUMENTS

| | | |
|---|---|---|
| 2007/0230818 A1 | 10/2007 | Messing et al. |
| 2007/0257866 A1* | 11/2007 | Cok .......................... G09G 3/20 345/76 |
| 2008/0309602 A1 | 12/2008 | Hwang |
| 2012/0287366 A1 | 11/2012 | Tanaka |
| 2013/0147858 A1* | 6/2013 | Omoto ..................... G09G 3/30 345/690 |

FOREIGN PATENT DOCUMENTS

| | | |
|---|---|---|
| JP | 2009-139699 A | 6/2009 |
| JP | 2011-164219 A | 8/2011 |

OTHER PUBLICATIONS

Office Action dated Oct. 27, 2015, issued by the Japanese Patent Office in Japanese Patent Application No. 2014-253595.

Office Action dated Feb. 26, 2016, issued by the Taiwan Advance Patent & Trademark Office in Taiwanese Patent & Application No. 103142059.

Office Action dated Jul. 7, 2014, issued by the Chinese Patent Office in Chinese Patent Application No. 201410320079.6.

\* cited by examiner

Green display (before compensation)    Green display (after compensation)

Gray display (before compensation)    Gray display (after compensation)

Gray display (before compensation)     Gray display (after compensation)

Blue display (before compensation)     Blue display (after compensation)

METHOD FOR REPAIRING ORGANIC LIGHT EMITTING DISPLAY

This application claims the benefit of Korea Patent Application No. 10-2013-0166672 filed on Dec. 30, 2013, which is incorporated herein by reference for all purposes as if fully set forth herein.

BACKGROUND OF THE INVENTION

Field of the Invention

The present invention relates to an active matrix organic light emitting display, and more particularly, to a method for repairing a defective pixel of an organic light emitting display.

Discussion of the Related Art

An active matrix organic light emitting display includes organic light emitting diodes (hereinafter, abbreviated to "OLEDs") capable of emitting light by itself and has advantages of a fast response time, a high light emitting efficiency, a high luminance, a wide viewing angle, and the like.

The OLED serving as a self-emitting element includes an anode electrode, a cathode electrode, and an organic compound layer formed between the anode electrode and the cathode electrode. The organic compound layer includes a hole injection layer HIL, a hole transport layer HTL, a light emitting layer EML, an electron transport layer ETL, and an electron injection layer EIL. When a driving voltage is applied to the anode electrode and the cathode electrode, holes passing through the hole transport layer HTL and electrons passing through the electron transport layer ETL move to the light emitting layer EML and form excitons. As a result, the light emitting layer EML generates visible light.

The organic light emitting display arranges subpixels each including the OLED in a matrix form and adjusts an amount of light emitted by each OLED depending on a gray scale of video data. Each subpixel includes a circuit unit for driving a light emitting unit, i.e., the OLED. The circuit unit includes a driving thin film transistor (TFT) controlling a driving current flowing in the OLED and a plurality of switching TFTs for programming a gate-source voltage of the driving TFT in conformity with a desired gray level.

The number of TFTs and signal lines formed on a display panel of the organic light emitting display is more than other display devices, and the organic light emitting display has more complex configuration than the other display devices. Therefore, a defect is frequently generated in the circuit unit of the organic light emitting display. In the organic light emitting display, the subpixel including the defective circuit unit does not normally emit light and is recognized as a dark spot. However, because a subpixel of a specific color having a relatively high transmittance has the higher visibility of the dark spot than the subpixels of other colors, a countermeasure is required. Hence, a dummy pixel structure shown in FIG. 1 was proposed.

In FIG. 1, "A" demotes a dummy pixel, and "B" demotes a normal pixel. The normal pixel B is formed in a display area, in which an image is implemented, and the dummy pixel A is formed in a non-display area outside the display area. The dummy pixel A is a pixel, which is additionally formed so as to perform a repair process. In the related art dummy pixel structure, when a defect is generated in a circuit unit of the normal pixel B, the repair process is performed to connect a light emitting unit of the normal pixel B to a circuit unit of the dummy pixel A, thereby causing the normal pixel B to emit light. Hence, the problem of the dark spot is removed.

The related art dummy pixel structure requires the separate dummy pixel A on the display panel of the organic light emitting display, so as to remove the defect. However, when the dummy pixel A is formed on the display panel, an occupation ratio (i.e., an aperture ratio) of the display area of the image displayed on the display panel is reduced by a formation area of the dummy pixel A.

SUMMARY OF THE INVENTION

Accordingly, the present invention is directed to a method for repairing an organic light emitting display that substantially obviates one or more of the problems due to liitations and disadvantages of the related art.

An object of the present invention is to provide a method for repairing a defective pixel of an organic light emitting display capable of avoiding a dark spot, which is a problem of a specific color subpixel having a high transmittance due to a defective circuit unit of the specific color subpixel, without reducing an aperture ratio.

Additional features and advantage of the invention will be set forth in the description which follows, and in part will be apparent from the description or may be learned by practice of the invention. The objectives and other advantage of the invention will be realized and attained by the structure particularly pointed out in the written description and claims hereof as well as the appended drawings.

To achieve these and other advantages and in accordance with the purpose of the present invention, a method for repairing an organic light emitting display having a plurality of unit pixels each including a white subpixelcomprises detecting a defective white subpixel by checking circuit units of the white subpixels, connecting a circuit unit of a neighboring subpixel positioned adjacent to the defective white subpixel in the unit pixel with a light emitting unit of the defective white subpixel using a repair conductive pattern, storing a repair position to which the repair conductive pattern is connected, and compensating for digital video data that will be input to the repair position.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Exemplary embodiments of the invention will be described with reference to FIGS. 2 to 11B.

Figure 1:
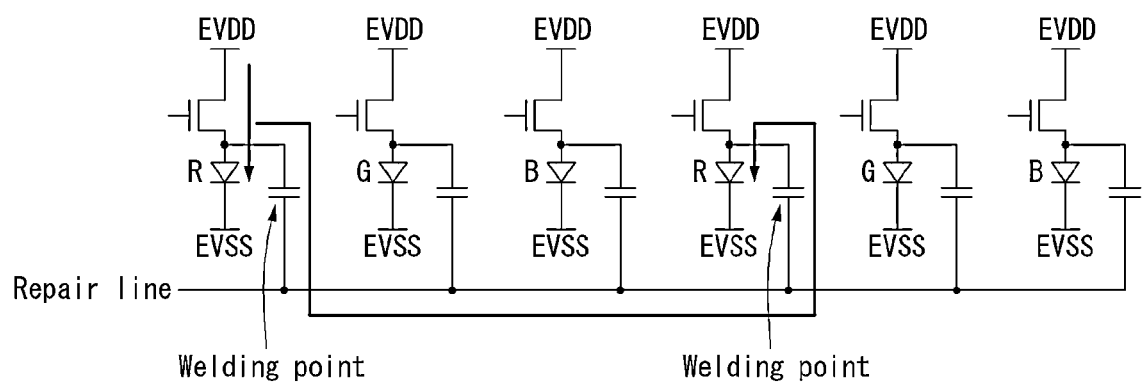
FIG. 1 illustrates a repair method using a related art dummy pixel structure.
Figure 2:
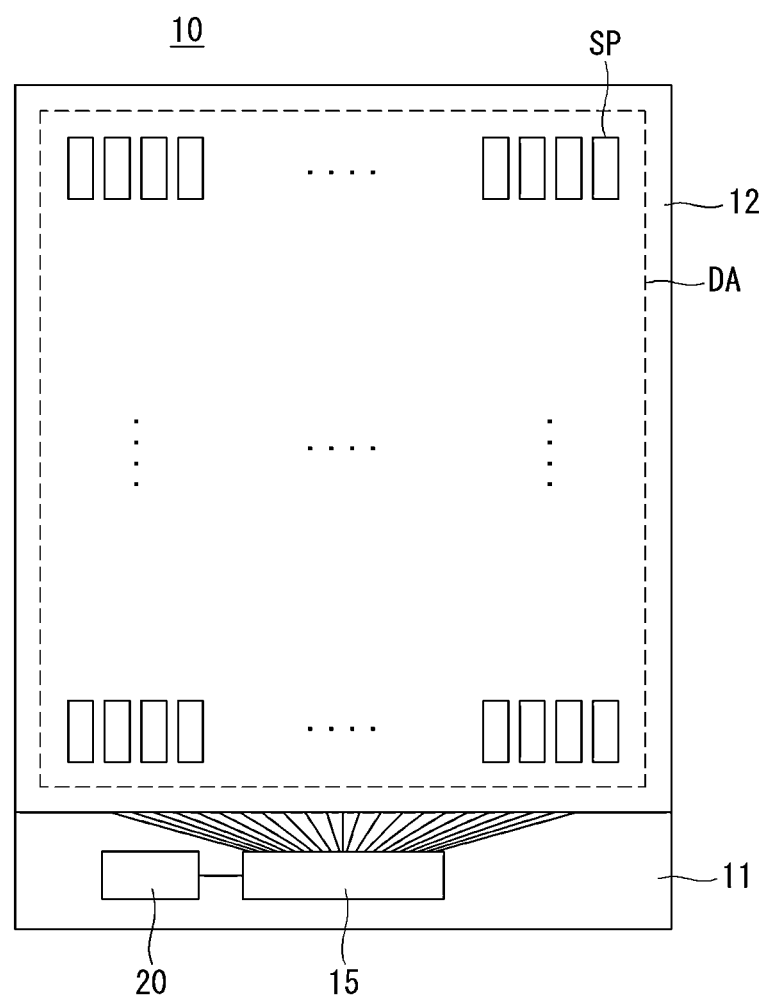
FIG. 2 is a block diagram of an organic light emitting display according to an exemplary embodiment of the invention.
Figure 3:
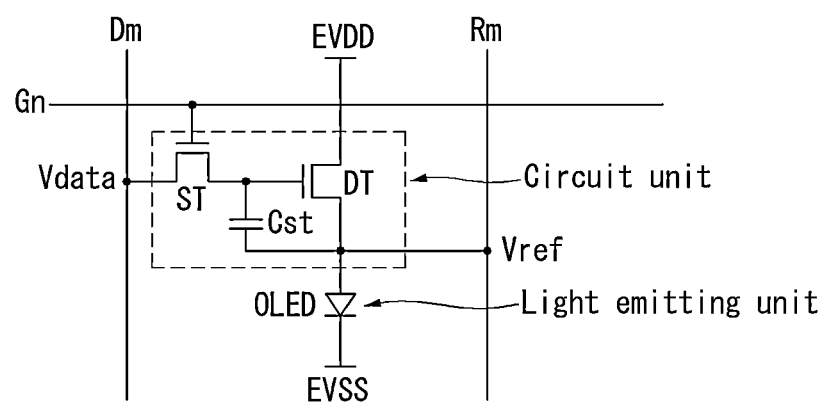
FIG. 3 shows a circuit configuration of a subpixel included in an organic light emitting display according to an exemplary embodiment of the invention.

FIG. 2 is a block diagram of an organic light emitting display according to an exemplary embodiment of the invention. FIG. 3 is a circuit diagram showing configuration of a subpixel included in the organic light emitting display according to the embodiment of the invention.

As shown in FIG. 2, an organic light emitting display 10 according to the embodiment of the invention includes a pixel array DA displaying an image through a plurality of subpixels SP, a driver unit 15 supplying a driving signal to the subpixels SP through a plurality of signal lines 16, and a timing controller 20 controlling an operation of the driver unit 15. The pixel array DA, the driver unit 15, and the timing controller 20 are formed on a first substrate 11, and the pixel array DA is sealed by a second substrate 12.

The pixel array DA includes a plurality of data lines, a plurality of gate lines crossing the data lines, and the plurality of subpixels SP respectively arranged at crossings of the data lines and the gate lines in a matrix form.

Each subpixel SP may use any known circuit configuration. FIG. 3 shows an example of circuit configuration of the subpixel SP. More specifically, FIG. 3 shows the simplest circuit configuration among various circuit configurations of the subpixel capable of compensating for an electrical characteristic deviation (including a threshold voltage, an electron mobility, etc.) of a driving thin film transistor (TFT). In the following description, the embodiment of the invention uses the circuit configuration shown in FIG. 3 as an example of the circuit configuration of the subpixel SP. Other circuit configurations may be used for the subpixel SP.

The data lines may include a plurality of data voltage supply lines Dm and a plurality of reference lines Rm. The gate lines may include a plurality of first gate lines Gn1 and a plurality of second gate lines Gn2.

The subpixel SP includes a light emitting unit and a circuit unit.

The light emitting unit is implemented as an organic light emitting diode (hereinafter, abbreviated to "OLED"), which emits light depending on a driving current flowing between a high potential power source EVDD and a low potential power source EVSS.

The circuit unit is connected to the data line and the gate line and operates in response to driving signals supplied through the data line and the gate line. The circuit unit may include a driving TFT DT controlling the driving current applied to the OLED and a plurality of switching TFTs ST1 and ST2 for programming a gate-source voltage of the driving TFT DT in conformity with a desired gray level. The circuit unit may further include a storage capacitor Cst for holding the programmed gate-source voltage of the driving TFT DT. The first switching TFT ST1 is turned on in response to a first scan pulse supplied through the first gate line Gn1 and thus may supply a data voltage to a gate electrode of the driving TFT DT. The second switching TFT ST2 is turned on in response to a second scan pulse supplied through the second gate line Gn2 and thus may supply an initialization voltage to a source electrode of the driving TFT DT or may charge the reference line Rm with a voltage of the source electrode of the driving TFT as a sensing voltage Vref. The sensing voltage Vref is a voltage based on the decision of a compensation value for compensating for an electrical characteristic deviation of the driving TFT DT.

The TFTs constituting the subpixel SP may be implemented as a p-type or an n-type. Further, the semiconductor layers of the TFTs constituting the subpixel SP may contain amorphous silicon, polycrystalline silicon, or oxide.

The driver unit 15 includes a data driver for driving the data voltage supply lines Dm and a gate driver for driving the gate lines Gn1 and Gn1.

The data driver converts digital video data into the data voltage under the control of the timing controller 20 and then may supply the data voltage to the data voltage supply lines Dm. The data driver may supply the initialization voltage to the reference lines Rm under the control of the timing controller 20. Further, the data driver may perform the sampling on the sensing voltage Vref charged to the reference lines Rm under the control of the timing controller 20.

The gate driver generates the first and second scan pulses under the control of the timing controller 20 and may sequentially supply the first and second scan pulses to the gate lines Gn1 and Gn1. The gate driver may be directly formed on the first substrate 11 through a gate driver-in panel (GIP) process.

The timing controller 20 controls operation timings of the data driver and the gate driver based on a plurality of timing signals. The timing controller 20 may modulate the digital video data based on the sensing voltage Vref and may supply the modulated digital video data to the data driver, so as to compensate for the electrical characteristic deviation of the driving TFT DT.

Figure 4A:
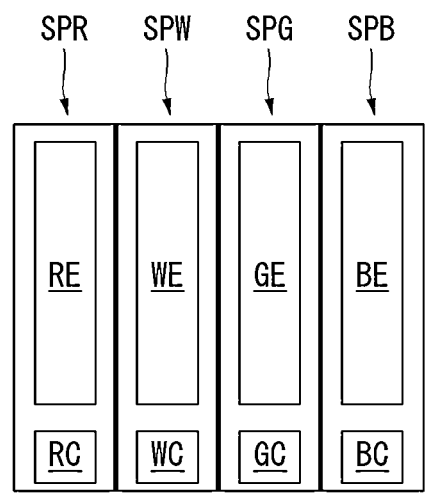
FIGS. 4A and 4B show examples of subpixels constituting one unit pixel.
Figure 4B:
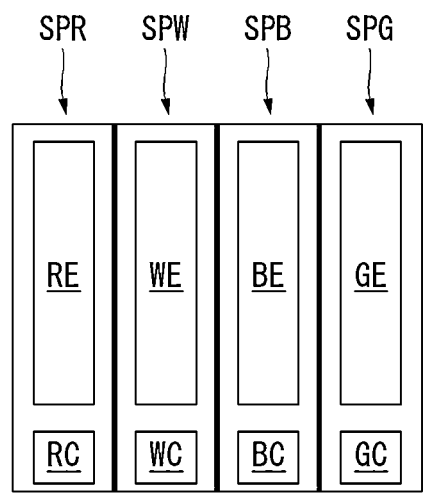

FIGS. 4A and 4B show examples of subpixels constituting one unit pixel.

The organic light emitting display 10 according to the embodiment of the invention may further include a white (W) subpixel SPW displaying white light, in addition to a red (R) subpixel SPR displaying red light, a green (G) subpixel SPG displaying green light, and a blue (B) subpixel SPB displaying blue light, so as to increase a luminance of an image displayed on a display panel. The one unit pixel may be configured as shown in FIGS. 4A and 4B depending on a disposition of the W subpixel SPW.

As shown in FIG. 4A, the unit pixel may have RWGB structure. More specifically, the unit pixel may have the RWGB structure of four subpixels, in which the R subpixel SPR, the W subpixel SPW, the G subpixel SPG, and the B subpixel SPB are arranged along a horizontal direction in the order named.

As shown in FIG. 4B, the unit pixel may have RWBG structure. More specifically, the unit pixel may have the RWBG structure of four subpixels, in which the R subpixel SPR, the W subpixel SPW, the B subpixel SPB, and the G subpixel SPG are arranged along the horizontal direction in the order named.

In this instance, the R subpixel SPR includes an R light emitting unit RE and an R circuit unit RC; the W subpixel SPW includes a W light emitting unit WE and a W circuit unit WC; the G subpixel SPG includes a G light emitting unit GE and a G circuit unit GC; and the B subpixel SPB includes a B light emitting unit BE and a B circuit unit BC.

The R light emitting unit RE is implemented as an R OLED. An anode electrode of the R OLED is connected to a source electrode of a driving TFT belonging to the R circuit unit RC and receives a driving current flowing between the source electrode and a drain electrode of the driving TFT.

The W light emitting unit WE is implemented as a W OLED. An anode electrode of the W OLED is connected to a source electrode of a driving TFT belonging to the W circuit unit WC and receives a driving current flowing between the source electrode and a drain electrode of the driving TFT.

The G light emitting unit GE is implemented as a G OLED. An anode electrode of the G OLED is connected to a source electrode of a driving TFT belonging to the G circuit unit GC and receives a driving current flowing between the source electrode and a drain electrode of the driving TFT.

The B light emitting unit BE is implemented as a B OLED. An anode electrode of the B OLED is connected to a source electrode of a driving TFT belonging to the B circuit unit BC and receives a driving current flowing between the source electrode and a drain electrode of the driving TFT.

Figure 5:
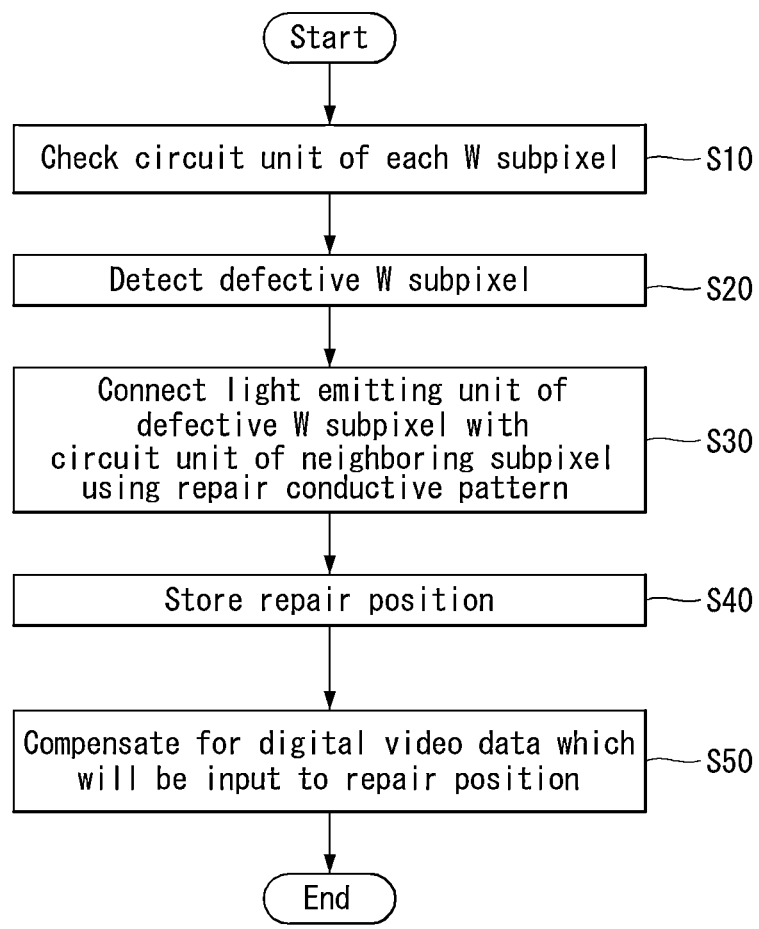
FIG. 5 sequentially illustrates a repair method of an organic light emitting display according to an exemplary embodiment of the invention.
Figure 6:
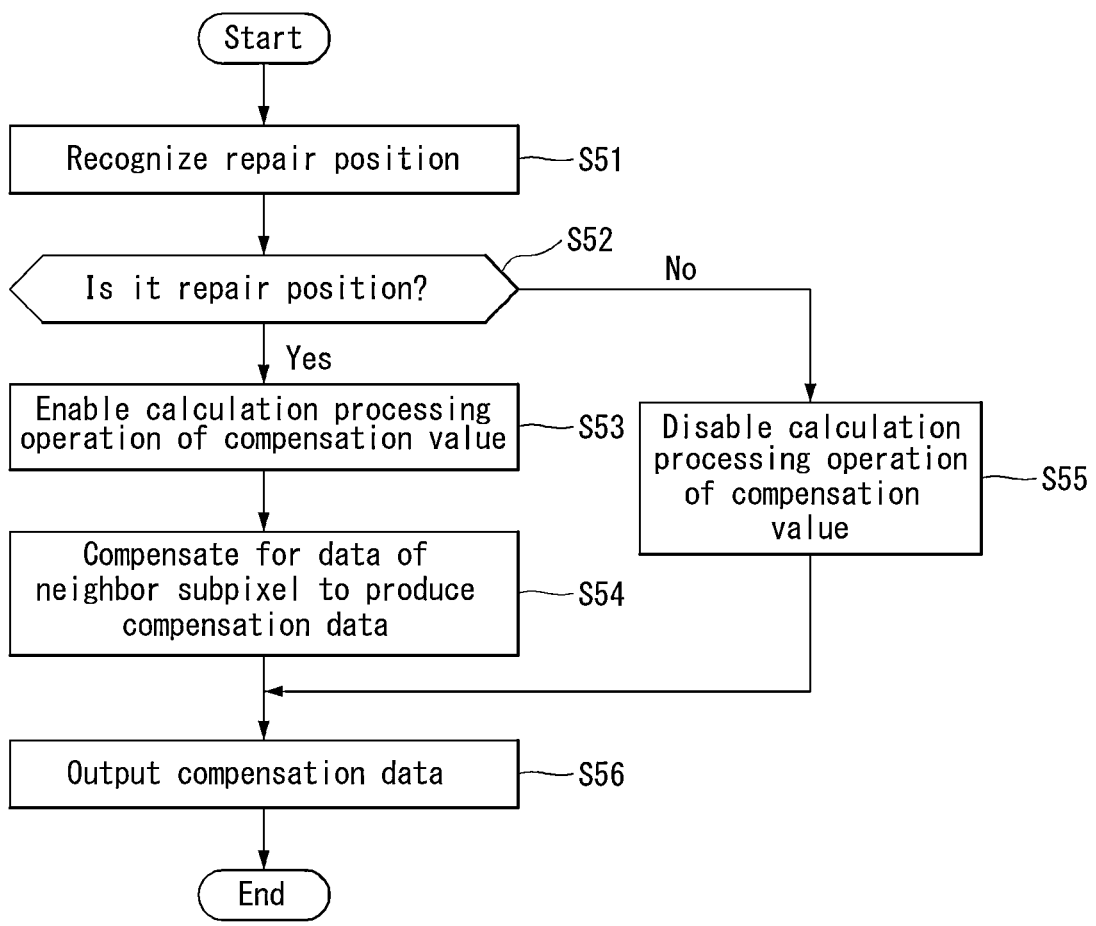
FIG. 6 illustrates in detail a data compensation step show in FIG. 5.
Figure 7:
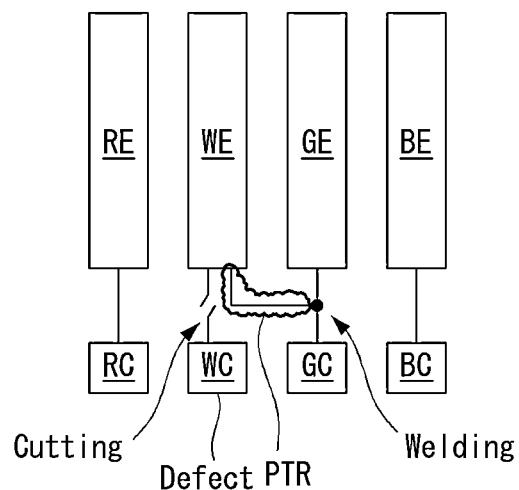
FIG. 7 illustrates a method for repairing a defective white subpixel in a unit pixel structure of RWGB shown in FIG. 4A.
Figure 8:
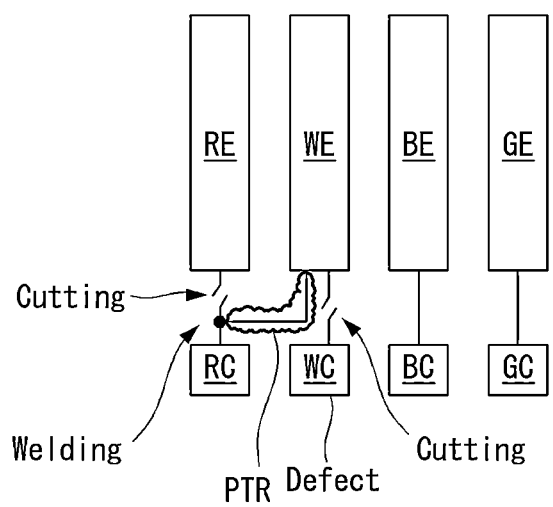
FIG. 8 illustrates a method for repairing a defective white subpixel in a unit pixel structure of RWBG shown in FIG. 4B.
Figure 9:
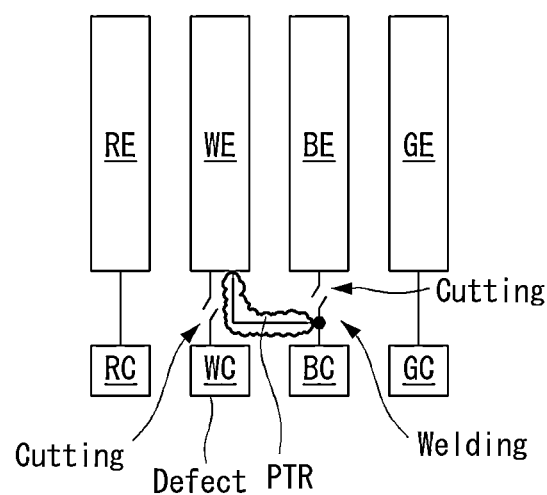
FIG. 9 illustrates another method for repairing a defective white subpixel in a unit pixel structure of RWBG shown in FIG. 4B.

FIG. 5 sequentially illustrates a repair method of the organic light emitting display according to the embodiment of the invention. FIG. 6 illustrates in detail a data compensation step show in FIG. 5. FIG. 7 illustrates a method for repairing a defective white subpixel in the unit pixel structure of RWGB shown in FIG. 4A. FIG. 8 illustrates a method for repairing a defective white subpixel in the unit pixel structure of RWBG shown in FIG. 4B. FIG. 9 illustrates another method for repairing a defective white subpixel in the unit pixel structure of RWBG shown in FIG. 4B.

The repair method according to the embodiment of the invention is to prevent a dark spot appearing in the W subpixel SPW with a high transmittance caused by the defective circuit unit of the W subpixel SPW without a reduction in an aperture ratio. In the RWGB subpixels, the W subpixel is the highest transmittance, and a transmittance of the G subpixel is greater than transmittances of the R and B subpixels. Even if the subpixel having the low transmittance is recognized as the dark spot in the repair process, the subpixel having the low transmittance is scarcely visible and thus does not matter so much. However, if the subpixel having the high transmittance is recognized as the dark spot, the subpixel having the high transmittance may be easily visible. Therefore, the embodiment of the invention performs the repair process only on the W subpixel having the highest transmittance. In particular, the embodiment of the invention uses a neighboring subpixel positioned adjacent to the W subpixel without forming a separate dummy pixel for the repair process. More specifically, when a defect is generated in the circuit unit of the W subpixel, the embodiment of the invention connects a circuit unit of a neighboring subpixel of the W subpixel to the light emitting unit of the defective W subpixel, thereby causing the W subpixel to normally emit light.

As shown in FIG. 5, the method for repairing the organic light emitting display according to the embodiment of the invention, which displays the image using the plurality of unit pixels each including the W subpixel SPW as in the RWGB structure shown in FIG. 4A or the RWBG structure shown in FIG. 4B, checks the circuit units WC of the W subpixels SPW and detects the defective W subpixel SPW in steps S10 and S20.

Next, the repair method according to the embodiment of the invention connects a circuit unit of a neighboring subpixel positioned adjacent to the defective W subpixel SPW in the unit pixel with the light emitting unit WE of the defective W subpixel SPW using a repair conductive pattern PTR (refer to FIGS. 7 to 9) in step S30. The embodiment of the invention may previously form the repair conductive pattern PTR, so that the repair conductive pattern PTR extends from the anode electrode of the OLED of the W subpixel SPW and then overlaps a source electrode of a driving TFT of the neighboring subpixel with an insulating layer interposed therebetween. When the corresponding W subpixel SPW is in need of repair, the repair method according to the embodiment of the invention melts the insulating layer in a welding process through the irradiation of a laser beam onto the overlap area. Hence, the repair conductive pattern PTR may be connected to the source electrode of the driving TFT of the neighboring subpixel.

Next, the repair method according to the embodiment of the invention stores a repair position, to which the repair conductive pattern PTR is connected, and then compensates for digital video data, which will be input to the repair position, in steps S40 and S50. In the embodiment disclosed herein, the repair position indicates a position of the neighboring subpixel. Thus, the digital video data, which will be input to the repair position, indicates digital video data, which will be input to the neighboring subpixel.

The step S50 related to the data compensation is described in detail below with reference to FIG. 6.

The repair method according to the embodiment of the invention enables a calculation processing operation of a compensation value when digital video data corresponding to the repair position is input with reference to the previously stored repair position, in steps S51, S52, and S53. In the embodiment disclosed herein, the calculation processing operation of the compensation value may be performed by a compensation algorithm based on a lookup table, in which the compensation value is previously stored.

Next, the repair method according to the embodiment of the invention modulates the digital video data, which will be input to the neighboring subpixel, based on the calculation processing operation of the compensation value to produce compensation data. Subsequently, the repair method according to the embodiment of the invention may output the compensation data to the neighboring subpixel in step S54.

The embodiment of the invention may properly determine the compensation data in consideration of a difference between physical properties, such a transmittance difference between the light emitting units of the defective W subpixel SPW and the neighboring subpixel, an emission efficiency difference between the OLEDs of the defective W subpixel SPW and the neighboring subpixel, and a size difference between the driving TFTs of the circuit units of the defective W subpixel SPW and the neighboring subpixel, so as to remove a luminance difference between the defective W subpixel SPW and a normal W subpixel SPW. In the embodiment disclosed herein, transmittances of the RWGB subpixels and emission efficiency magnitudes of the OLEDs of the RWGB subpixels are as follows: W subpixel SPW≥G subpixel SPG≥R subpixel SPR≈B subpixel SPB. The sizes of the driving TFTs of the RWGB subpixels are as follows: W subpixel SPW≈G subpixel SPG<R subpixel SPR≈B subpixel SPB.

Examples of a method for connecting the circuit unit of the neighboring subpixel to the light emitting unit of the defective W subpixel SPW using the repair conductive pattern PTR include a share connection method and a switch connection method.

As shown in FIG. 7, the share connection method is used to select the G subpixel SPG as the neighboring subpixel in the unit pixel structure of RWGB shown in FIG. 4A.

In the share connection method, the circuit unit GC of the G subpixel SPG is connected to the light emitting unit WE of the defective W subpixel SPW as well as the light emitting unit GE of the G subpixel SPG. For this, as shown in FIG. 7, the embodiment of the invention connects the anode electrode of the OLED corresponding to the light emitting unit WE of the defective W subpixel SPW to the driving TFT DT belonging to the circuit unit GC of the G subpixel SPG using the repair conductive pattern PTR.

In other words, the embodiment of the invention performs the repair process (for example, the connection process) on the repair conductive pattern PTR through a laser welding process, thereby commonly connecting the driving TFT DT belonging to the circuit unit GC of the G subpixel SPG to the anode electrode of the OLED corresponding to the light emitting unit GE of the G subpixel SPG and the anode electrode of the OLED corresponding to the light emitting unit WE of the defective W subpixel SPW. Further, the embodiment of the invention disconnects the driving TFT DT belonging to the circuit unit WC of the defective W subpixel SPW from the anode electrode of the defective W subpixel SPW through a laser cutting process.

Because there is a small difference between the physical properties of the G subpixel SPG and the W subpixel SPW, it is more advantageous for the maintenance of the image quality to connect the G subpixel SPG and the W subpixel SPW using the above-described share connection method.

In the share connection method, the circuit unit GC of the G subpixel SPG has to drive the light emitting unit WE of the defective W subpixel SPW as well as the light emitting unit GE of the G subpixel SPG. Thus, the embodiment of the invention may perform a modulation process, so that data to be applied to the driving TFT DT of the G subpixel SPG is greater than its original value in a step for compensating for data, which will be input to the G subpixel SPG.

The switch connection method is used to select the R or B subpixel SPR or SPB having the low transmittance as the neighboring subpixel in the unit pixel structure of RWBG shown in FIG. 4B.

As shown in FIG. 8, in the switch connection method used when the R subpixel SPR is selected as the neighboring subpixel, the circuit unit RC of the R subpixel SPR is connected only to the light emitting unit WE of the defective W subpixel SPW instead of the light emitting unit RE of the R subpixel SPR. For this, as shown in FIG. 8, the embodiment of the invention connects the anode electrode of the OLED corresponding to the light emitting unit WE of the defective W subpixel SPW to the driving TFT DT belonging to the circuit unit RC of the R subpixel SPR using the repair conductive pattern PTR.

In other words, the embodiment of the invention performs the repair process (for example, the connection process) on the repair conductive pattern PTR through the laser welding process, thereby connecting the driving TFT DT belonging to the circuit unit RC of the R subpixel SPR to the anode electrode of the OLED corresponding to the light emitting unit WE of the defective W subpixel SPW. Further, the embodiment of the invention disconnects the driving TFT DT of the R subpixel SPR from the anode electrode of the OLED of the R subpixel SPR through the laser cutting process and also disconnects the driving TFT DT of the defective W subpixel SPW from the anode electrode of the OLED of the defective W subpixel SPW through the laser cutting process.

Because there is a large difference between the physical properties of the R subpixel SPR and the W subpixel SPW, it is more advantageous for the maintenance of the image quality to connect the R subpixel SPR and the W subpixel SPW using the above-described switch connection method.

In the switch connection method, the circuit unit RC of the R subpixel SPR has to drive only the light emitting unit WE of the defective W subpixel SPW instead of the light emitting unit RE of the R subpixel SPR. Thus, the embodiment of the invention may perform a modulation process, so that data to be applied to the driving TFT DT of the R subpixel SPR is less than its original value in consideration of the difference between the physical properties of the R subpixel SPR and the W subpixel SPW in a step for compensating for data, which will be input to the R subpixel SPR.

As shown in FIG. 9, in the switch connection method used when the B subpixel SPB is selected as the neighboring subpixel, the circuit unit BC of the B subpixel SPB is connected only to the light emitting unit WE of the defective W subpixel SPW instead of the light emitting unit BE of the B subpixel SPB. For this, as shown in FIG. 9, the embodiment of the invention connects the anode electrode of the OLED corresponding to the light emitting unit WE of the defective W subpixel SPW to the driving TFT DT belonging to the circuit unit BC of the B subpixel SPB using the repair conductive pattern PTR.

In other words, the embodiment of the invention performs the repair process (for example, the connection process) on the repair conductive pattern PTR through the laser welding process, thereby connecting the driving TFT DT belonging to the circuit unit BC of the B subpixel SPB to the anode electrode of the OLED corresponding to the light emitting unit WE of the defective W subpixel SPW. Further, the embodiment of the invention disconnects the driving TFT DT of the B subpixel SPB from the anode electrode of the OLED of the B subpixel SPB through the laser cutting process and also disconnects the driving TFT DT of the defective W subpixel SPW from the anode electrode of the OLED of the defective W subpixel SPW through the laser cutting process.

Because there is a large difference between the physical properties of the B subpixel SPB and the W subpixel SPW in the same manner as the R subpixel SPR, it is more advantageous for the maintenance of the image quality to connect the B subpixel SPB and the W subpixel SPW using the above-described switch connection method.

In the switch connection method, the circuit unit BC of the B subpixel SPB has to drive only the light emitting unit WE of the defective W subpixel SPW instead of the light emitting unit BE of the B subpixel SPB. Thus, the embodiment of the invention may perform a modulation process, so that data to be applied to the driving TFT DT of the B subpixel SPB is less than its original value in consideration of the difference between the physical properties of the B subpixel SPB and the W subpixel SPW in a step for compensating for data, which will be input to the B subpixel SPB.

Figure 10A:
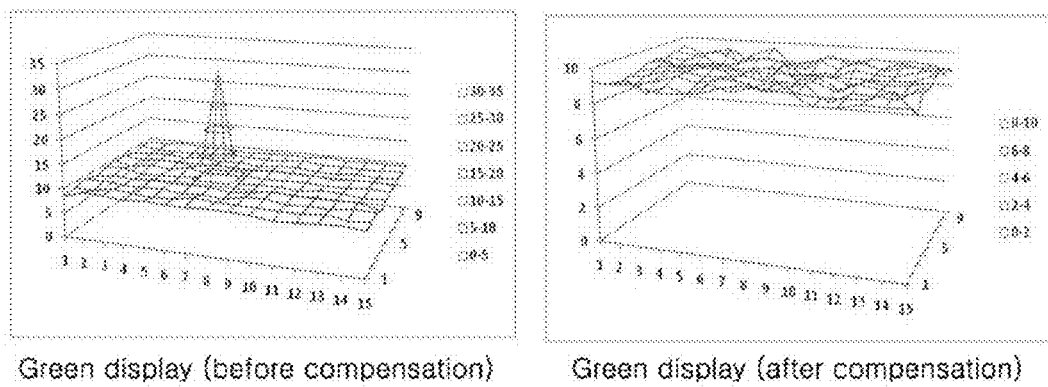
FIG. 10A shows changes in a luminance of a green color before and after the data compensation depending on the repair method illustrated in FIG. 7.
Figure 10B:
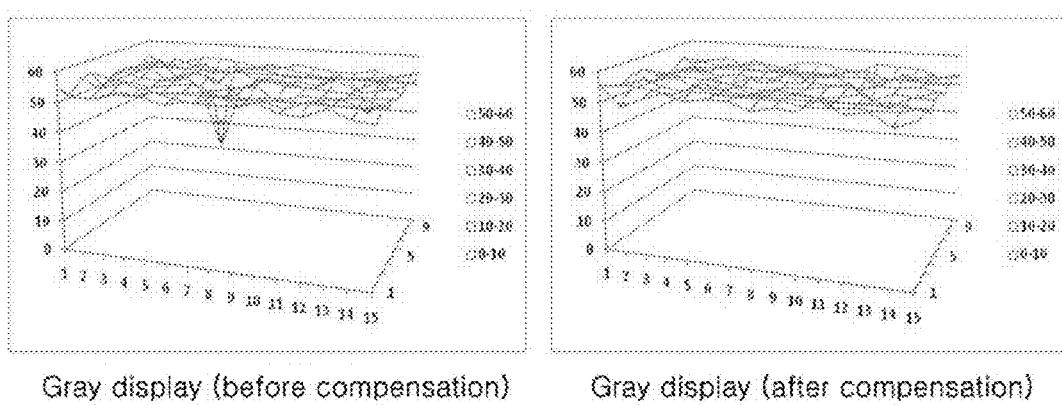
FIG. 10B shows changes in a luminance of a gray color before and after the data compensation depending on the repair method illustrated in FIG. 7.
Figure 11A:
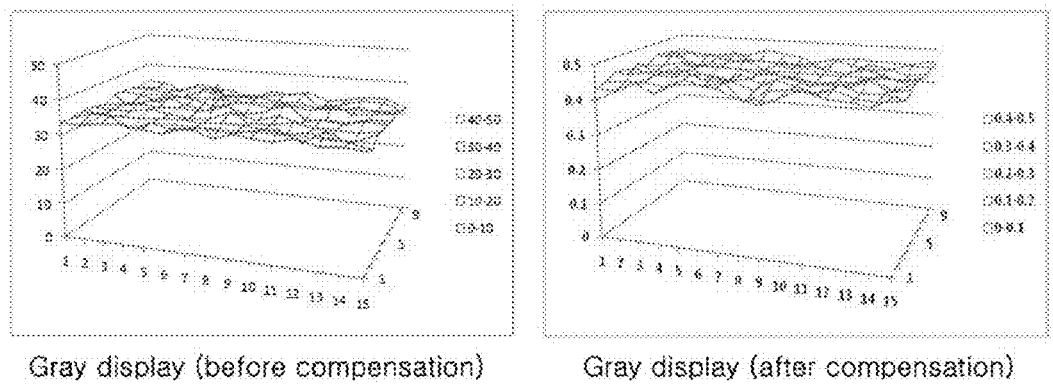
FIG. 11A shows changes in a luminance of a gray color before and after the data compensation depending on the repair method illustrated in FIG. 9.
Figure 11B:
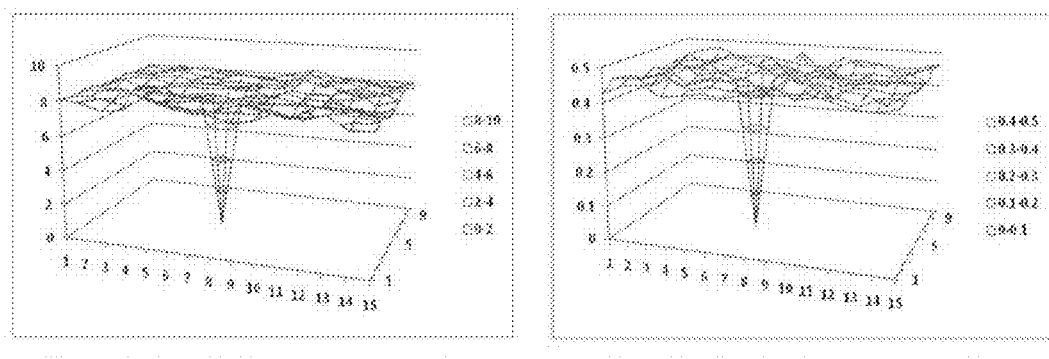
FIG. 11B shows changes in a luminance of a blue color before and after the data compensation depending on the repair method illustrated in FIG. 9.

FIG. 10A shows changes in a luminance of a green color before and after the data compensation depending on the repair method illustrated in FIG. 7. FIG. 10B shows changes in a luminance of a gray color before and after the data compensation depending on the repair method illustrated in FIG. 7. FIG. 11A shows changes in a luminance of a gray color before and after the data compensation depending on the repair method illustrated in FIG. 9. FIG. 11B shows changes in a luminance of a blue color before and after the data compensation depending on the repair method illustrated in FIG. 9. In FIGS. 10A, 10B, 11A, and 11B, Z-axis indicates a luminance.

In the share connection method shown in FIG. 7, because the light emitting unit WE of the defective W subpixel SPW and the light emitting unit GE of the G subpixel SPG share the circuit unit GC of the G subpixel SPG with each other, the dark spot caused by the defective circuit unit WC of the W subpixel SPW may be avoided. However, in this instance, when a green color is displayed as shown in FIG. 10A, a luminance spike may be generated. Alternatively, when a gray color is displayed as shown in FIG. 10B, a luminance drop may be generated.

However, when the data is compensated through the above-described repair method according to the embodiment of the invention, the luminance spike and the luminance drop are removed as shown in FIGS. 10A and 10B. Hence, the image quality is improved.

In the switch connection method shown in FIG. 9, because the circuit unit BC of the B subpixel SPB may drive the light emitting unit WE of the defective W subpixel SPW, the dark spot caused by the defective circuit unit WC of the W subpixel SPW may be avoided. However, in this instance, when a gray color is displayed as shown in FIG. 11A, the luminance may be distorted due to the B subpixel SPB recognized as the dark spot. Alternatively, when a blue color is displayed as shown in FIG. 11B, the luminance drop may be generated due to the B subpixel SPB recognized as the dark spot.

When the data is compensated through the above-described repair method according to the embodiment of the invention, the luminance distortion may be compensated in the display of the gray color shown in FIG. 11A. However, the B subpixel SPB remains in a state of the dark spot as shown in FIG. 11B irrespective of the data compensation. However, because the dark spot of the B subpixel SPB has the low visibility, the dark spot of the B subpixel SPB does not matter in the maintenance of the image quality. The operation effect may be equally obtained in the switch connection method shown in FIG. 8.

As described above, the embodiment of the invention connects the circuit unit of the neighboring subpixel positioned adjacent to the defective W subpixel and the light emitting unit of the defective W subpixel in the unit pixel through the repair conductive pattern and properly compensates for the digital video data, which will be input to the neighboring subpixel, thereby avoiding the dark spot appearing in the W subpixel having the high transmittance due to the defective circuit unit of the W subpixel, without reducing the aperture ratio.

The compensating of the digital video data, which will be input to the repair position, includes enabling a calculation processing operation of a compensation value when the digital video data corresponding to the repair position is input, and modulating the digital video data, based on the calculation processing operation of the compensation value to produce compensation data, wherein the digital video data, which will be input to the repair position, indicates digital video data, which will be input to the neighboring subpixel.

The compensation data is differently determined by a transmittance difference between the light emitting units of the defective white subpixel and the neighboring subpixel, an emission efficiency difference between the light emitting units of the defective white subpixel and the neighboring subpixel, and a size difference between driving thin film transistors (TFTs) of the circuit units of the defective white subpixel and the neighboring subpixel.

The unit pixel having the defective white subpixel includes four subpixels arranged along a horizontal direction, and the four subpixels include a red subpixel displaying red light, the defective white subpixel, a green subpixel displaying green light, and a blue subpixel displaying blue light, which are arranged along the horizontal direction in the order named. In this instance, the green subpixel is selected as the neighboring subpixel. The repair conductive pattern connects an anode electrode belonging to the light emitting unit of the defective white subpixel to a driving thin film transistor (TFT) belonging to a circuit unit of the green subpixel.

When the repair conductive pattern is connected, the driving TFT belonging to the circuit unit of the green subpixel is commonly connected to an anode electrode belonging to a light emitting unit of the green subpixel and the anode electrode belonging to the light emitting unit of the defective white subpixel through a welding process. A driving TFT belonging to the circuit unit of the defective white subpixel is disconnected from the anode electrode belonging to the light emitting unit of the defective white subpixel through a cutting process.

The compensating of the digital video data, which will be input to the repair position, includes performing a modulation process so that data, which will be applied to the driving TFT of the green subpixel, is greater than its original value.

The unit pixel including the defective white subpixel includes four subpixels arranged along a horizontal direction, and the four subpixels include a red subpixel displaying red light, the defective white subpixel, a blue subpixel displaying blue light, and a green subpixel displaying green light, which are arranged along the horizontal direction in the order named. In this instance, the red subpixel is selected as the neighboring subpixel. The repair conductive pattern connects an anode electrode belonging to the light emitting unit of the defective white subpixel to a driving TFT belonging to a circuit unit of the red subpixel.

When the repair conductive pattern is connected, the driving TFT belonging to the circuit unit of the red subpixel is connected to the anode electrode belonging to the light emitting unit of the defective white subpixel through a welding process and also is disconnected from an anode electrode belonging to a light emitting unit of the red subpixel through a cutting process. A driving TFT belonging to the circuit unit of the defective white subpixel is disconnected from the anode electrode belonging to the light emitting unit of the defective white subpixel through the cutting process.

The compensating of the digital video data, which will be input to the repair position, includes performing a modulation process so that data, which will be applied to the driving TFT of the red subpixel, is less than its original value.

The unit pixel including the defective white subpixel includes four subpixels arranged along a horizontal direction, and the four subpixels include a red subpixel displaying red light, the defective white subpixel, a blue subpixel displaying blue light, and a green subpixel displaying green light, which are arranged along the horizontal direction in the order named. In this instance, the blue subpixel is selected as the neighboring subpixel. The repair conductive pattern connects an anode electrode belonging to the light emitting unit of the defective white subpixel to a driving TFT belonging to a circuit unit of the blue subpixel.

When the repair conductive pattern is connected, the driving TFT belonging to the circuit unit of the blue subpixel is connected to the anode electrode belonging to the light emitting unit of the defective white subpixel through a welding process and also is disconnected from an anode electrode belonging to a light emitting unit of the blue subpixel through a cutting process. A driving TFT belonging to the circuit unit of the defective white subpixel is disconnected from the anode electrode belonging to the light emitting unit of the defective white subpixel through the cutting process.

The compensating of the digital video data, which will be input to the repair position, includes performing a modulation process so that data, which will be applied to the driving TFT of the blue subpixel, is less than its original value.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. Thus, it is intended that the present invention cover the variations and modifications of this invention provided they come within the scope of the appended claims and their equivalents.

What is claimed is:

1. A method for repairing an organic light emitting display having a plurality of unit pixels each including a white subpixel, the method comprising:
   detecting a defective white subpixel by checking circuit units of the white subpixels;
   connecting a circuit unit of a neighboring subpixel positioned adjacent to the defective white subpixel in the unit pixel with a light emitting unit of the defective white subpixel using a repair conductive pattern, the neighboring subpixel having a color other than white;
   storing a repair position to which the repair conductive pattern is connected; and
   compensating for digital video data that will be input to the repair position by driving the circuit unit of the neighboring subpixel to drive the light emitting unit of the defective white subpixel.

2. The method of claim 1, wherein the compensating of the digital video data, which will be input to the repair position, includes:
   enabling a calculation processing operation of a compensation value when the digital video data corresponding to the repair position is input; and
   modulating the digital video data, based on the calculation processing operation of the compensation value to produce compensation data,
   wherein the digital video data, which will be input to the repair position, indicates digital video data, which will be input to the neighboring subpixel.

3. The method of claim 2, wherein the compensation data is differently determined by:
   a transmittance difference between the light emitting units of the defective white subpixel and the neighboring subpixel;
   an emission efficiency difference between the light emitting units of the defective white subpixel and the neighboring subpixel; and
   a size difference between driving thin film transistors (TFTs) of the circuit units of the defective white subpixel and the neighboring subpixel.

4. The method of claim 1, wherein:
   the unit pixel having the defective white subpixel includes four subpixels arranged along a horizontal direction;
   the four subpixels include a red subpixel displaying red light, the defective white subpixel, a green subpixel displaying green light, and a blue subpixel displaying blue light, which are arranged along the horizontal direction in the order named;
   the green subpixel is selected as the neighboring subpixel; and
   the repair conductive pattern connects an anode electrode belonging to the light emitting unit of the defective white subpixel to a driving thin film transistor (TFT) belonging to a circuit unit of the green subpixel.

5. The method of claim 4, wherein:
   when the repair conductive pattern is connected, the driving TFT belonging to the circuit unit of the green subpixel is commonly connected to an anode electrode belonging to a light emitting unit of the green subpixel and the anode electrode belonging to the light emitting unit of the defective white subpixel through a welding process; and
   a driving TFT belonging to the circuit unit of the defective white subpixel is disconnected from the anode electrode belonging to the light emitting unit of the defective white subpixel through a cutting process.

6. The method of claim 5, wherein the compensating of the digital video data, which will be input to the repair position, includes performing a modulation process so that data, which will be applied to the driving TFT of the green subpixel, is greater than its original value.

7. The method of claim 1, wherein:
   the unit pixel including the defective white subpixel includes four subpixels arranged along a horizontal direction;
   the four subpixels include a red subpixel displaying red light, the defective white subpixel, a blue subpixel displaying blue light, and a green subpixel displaying green light, which are arranged along the horizontal direction in the order named;

the red subpixel is selected as the neighboring subpixel; and the repair conductive pattern connects an anode electrode belonging to the light emitting unit of the defective white subpixel to a driving TFT belonging to a circuit unit of the red subpixel.

8. The method of claim 7, wherein:

when the repair conductive pattern is connected, the driving TFT belonging to the circuit unit of the red subpixel is:
  connected to the anode electrode belonging to the light emitting unit of the defective white subpixel through a welding process; and
  disconnected from an anode electrode belonging to a light emitting unit of the red subpixel through a cutting process; and
a driving TFT belonging to the circuit unit of the defective white subpixel is disconnected from the anode electrode belonging to the light emitting unit of the defective white subpixel through the cutting process.

9. The method of claim 8, wherein the compensating of the digital video data, which will be input to the repair position, includes performing a modulation process so that data, which will be applied to the driving TFT of the red subpixel, is less than its original value.

10. The method of claim 1, wherein:

the unit pixel including the defective white subpixel includes four subpixels arranged along a horizontal direction;

the four subpixels include a red subpixel displaying red light, the defective white subpixel, a blue subpixel displaying blue light, and a green subpixel displaying green light, which are arranged along the horizontal direction in the order named;

the blue subpixel is selected as the neighboring subpixel; and the repair conductive pattern connects an anode electrode belonging to the light emitting unit of the defective white subpixel to a driving TFT belonging to a circuit unit of the blue subpixel.

11. The method of claim 10, wherein:

when the repair conductive pattern is connected, the driving TFT belonging to the circuit unit of the blue subpixel is:
  connected to the anode electrode belonging to the light emitting unit of the defective white subpixel through a welding process; and
  disconnected from an anode electrode belonging to a light emitting unit of the blue subpixel through a cutting process; and
wherein a driving TFT belonging to the circuit unit of the defective white subpixel is disconnected from the anode electrode belonging to the light emitting unit of the defective white subpixel through the cutting process.

12. The method of claim 11, wherein the compensating of the digital video data, which will be input to the repair position, includes performing a modulation process so that data, which will be applied to the driving TFT of the blue subpixel, is less than its original value.

* * * * *